(12) United States Patent
Feltz et al.

(10) Patent No.: US 7,408,292 B2
(45) Date of Patent: Aug. 5, 2008

(54) PIEZOELECTRIC CERAMIC MATERIAL MULTI-LAYERED COMPONENT AND METHOD FOR THE PRODUCTION OF A CERAMIC MATERIAL

(75) Inventors: Adalbert Feltz, Deutschlandsberg (AT); Heinz Florian, Bad Gams (AT); Marion Ottlinger, Deutschlandsberg (AT); Sigrid Ragossnig, Friesach (AT); Peter Sedlmaier, Ruden (AT)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 10/574,209

(22) PCT Filed: Sep. 29, 2004

(86) PCT No.: PCT/DE2004/002168

§ 371 (c)(1),
(2), (4) Date: Jan. 30, 2007

(87) PCT Pub. No.: WO2005/034256

PCT Pub. Date: Apr. 14, 2005

(65) Prior Publication Data

US 2007/0267948 A1    Nov. 22, 2007

(30) Foreign Application Priority Data

Sep. 3, 2003   (DE) ................. 103 45 499

(51) Int. Cl.
*H01L 41/187*   (2006.01)

(52) U.S. Cl. ................. 310/358; 252/62.9 PZ; 252/62.9 R; 501/134

(58) Field of Classification Search ................. 310/358; 252/62.9 R, 62.9 PZ; 501/134
See application file for complete search history.

(56) References Cited

U.S. PATENT DOCUMENTS

| | | | | |
|---|---|---|---|---|
| 4,056,654 A | * | 11/1977 | Kompanek | 428/409 |
| 4,876,179 A | * | 10/1989 | Bast et al. | 430/320 |
| 5,135,907 A | * | 8/1992 | Mazdiyasni et al. | 505/440 |
| 5,419,844 A | * | 5/1995 | Hase et al. | 252/62.9 R |
| 5,766,502 A | * | 6/1998 | Hase et al. | 252/62.9 PZ |
| 5,792,379 A | | 8/1998 | Dai et al. | |
| 5,985,404 A | * | 11/1999 | Yano et al. | 428/846.1 |

(Continued)

FOREIGN PATENT DOCUMENTS

DE    100 62 672    8/2001

(Continued)

OTHER PUBLICATIONS

English translation of Written Opinion for PCT/DE2004/002168.

(Continued)

*Primary Examiner*—Jaydi A San Martin
(74) *Attorney, Agent, or Firm*—Fish & Richardson P.C.

(57) ABSTRACT

The invention relates to a piezoelectric ceramic material having the general composition $ABO_3$ with at least a proportion of the PZT ceramic having a composition of the invention with Cu cations. The proportion of Zr and Ti cations is selected based upon the content of Cu cations, such that the ceramic material is tailored to the morphotropic phase boundary. The invention further discloses a method for producing a ceramic material of this type.

13 Claims, 1 Drawing Sheet

U.S. PATENT DOCUMENTS

| | | | | |
|---|---|---|---|---|
| 6,096,434 | A * | 8/2000 | Yano et al. | 428/446 |
| 6,203,613 | B1 * | 3/2001 | Gates et al. | 117/104 |
| 6,709,776 | B2 * | 3/2004 | Noguchi et al. | 428/702 |
| 6,873,229 | B2 * | 3/2005 | Pike | 333/246 |
| 2002/0098333 | A1 | 7/2002 | Feltz et al. | |
| 2003/0168624 | A1 | 9/2003 | Hammer et al. | |
| 2004/0196385 | A1 * | 10/2004 | Silverbrook | 348/231.6 |
| 2004/0212641 | A1 * | 10/2004 | Silverbrook | 347/3 |
| 2005/0041055 | A1 * | 2/2005 | Silverbrook | 347/20 |
| 2006/0183249 | A1 * | 8/2006 | Yao et al. | 438/3 |

FOREIGN PATENT DOCUMENTS

| | | |
|---|---|---|
| DE | 101 01 188 | 8/2002 |
| DE | 200 23 051 | 2/2003 |
| WO | WO01/45138 | 6/2001 |

OTHER PUBLICATIONS

Z. Bryknar et al "ESR and Optical Spectroscopy of Copper-doped PLZT Electro-optic Ceramics" Applied Physics, 1998, pp. 555-559; XP-002344617.

* cited by examiner

PIEZOELECTRIC CERAMIC MATERIAL MULTI-LAYERED COMPONENT AND METHOD FOR THE PRODUCTION OF A CERAMIC MATERIAL

TECHNICAL FIELD

A piezoelectric ceramic material and a method for producing the piezoelectric ceramic material are disclosed. The piezoelectric ceramic material has having the general composition $ABO_3$, which essentially contains lead zirconate titanate and has a perovskite lattice structure, in which A stands for A positions and B stands for B positions in the crystal lattice.

This type of ceramic material is especially well suited for use in multilayer components comprising a stack of multiple ceramic layers and electrode layers arranged alternatingly, one on top of another.

Piezoceramic components of this type can be used, for example, as actuators in piezo stacks, in which a low-inertia mechanical deflection of comparatively high force is achieved by means of voltage activation; they may also allow the generation of high electric voltages or may be used in relevant devices in the detection of mechanical oscillations or the generation of acoustic vibrations.

BACKGROUND

Prior technical solutions have been based predominantly on ceramic masses of the perovskite structural type having the general formula $ABO_3$, wherein the piezoelectric properties are brought to bear in the ferroelectric state. Lead zirconate titanate ceramics that have been modified using select additives, $Pb(Zr_{1-x}Ti_x)O_3=PZT$, the composition of which is tailored to the so-called morphotropic phase boundary of two coexisting ferroelectric phases, have proven particularly advantageous. Between the ceramic layers, which are produced according to methods customarily used with ceramics, especially ceramic foil technology, precious metal internal electrodes, for example Ag/Pd in a 70/30 molar ratio, are applied by means of the screen printing process. With up to several hundred electrode layers per component, these components are burdened with substantial costs. The precious metal electrodes enable the thermal elimination, in air, of dispersants and binders and other organic additives, along with the organic components of the screen printing metal paste, from the multilayer stacks by means of depolymerization and oxidation, thus enabling a subsequent sinter densification at ca. 1100 to 1150° C. without reduction effects that could, for example, be caused by residual carbon, which would negatively influence the properties of the ceramic as a result of reduction reactions.

In the publication DE 20023051 U1 a method for producing piezoelectric components is disclosed, which uses copper-containing electrodes in place of the costly Ag/Pd internal electrodes, wherein the piezoelectric ratings are based upon ceramic masses having the preferred composition $Pb_{0.97}Nd_{0.02}\gamma_{0.01}(Zr_{0.54}Ti_{0.46})O_3$. The symbol "γ" stands for a vacancy in the crystal lattice. Ceramic masses having this type of composition are particularly well suited for use in Ag/Pd internal electrodes and for air sintering at 1120° C., and are tailored with respect to their piezoelectric properties such that they partially take up silver from the internal electrodes. The acquisition of the silver is made possible by the presence of atmospheric oxygen during the sintering process. At the same time, grain growth is promoted, so that in the finished component a ceramic composition $Pb_{0.96}Nd_{0.02}Ag_{0.02}(Zr_{0.54}Ti_{0.46})O_3$ results, with a grain structure that is favorable for the intended application.

In contrast, the multilayer piezoelectric components that have the same initial composition as the ceramic and copper-containing internal electrodes do not have this type of silver content, with the result that the morphotropic phase boundary that is advantageous for optimal piezoelectric properties is no longer present in the ceramic, and the average grain size is smaller. The latter is primarily also a result of the lower sintering temperature of ca. 1000° C., which must be maintained when internal electrodes containing copper are used, in order to prevent a melting of the electrodes.

Although, with the sintering of multilayer components based upon the PZT ceramic of the composition $Pb_{0.97}Nd_{0.02}\gamma_{0.01}(Zr_{0.54}Ti_{0.46})O_3$ with Ag/Pd internal electrodes in an air atmosphere at 1120° C., the silver becomes inserted evenly over the entire cross-section of the sintered ceramic layer, so that the composition $Pb_{0.96}Nd_{0.02}Ag_{0.02}(Zr_{0.54}Ti_{0.46})O_3$ is established in the piezoceramic, with the sintering of a multilayer ceramic component that has copper-containing internal electrodes the copper content in ceramic layers having the above-named composition amounts to only ca. 0.1 m %.

The deviation from the morphotropic phase boundary is perceived for example in a lower dielectric constant $\in$ and in an increase in the temperature coefficient TK$\in$ of the DK (measured, for example, between −20° C. and 60° C., ascending) and also in a lower degree of deflection $S_3$ at the same field intensity $E_3$ (DK=dielectric constant).

The deflection parameter $d_{33}$ (=piezoelectric charge constant) is defined by the equation $S_3 = d_{33} \cdot E_3$. Furthermore, in the assessment of the suitability of a piezoceramic for use in multilayer components the dielectric loss L is the critical factor, which, as a function of the electric activation, causes a more or less significant temperature increase in the component and can be described using the degree of efficiency $\eta = E_a/E_e$ ($E_a$=energy that can be coupled out, $E_e$=coupled-in energy) combined with the electric field intensity that is associated with a certain degree of deflection E=U/d (d=thickness of the ceramic layer), by means of the equation $L=(1/2)U^2 C (1-\eta)$ (C=capacitance).

SUMMARY

A ceramic material of the above-described type that is especially well suited for use in multilayer ceramic components, and which will ensure a diminished dielectric loss L thus ensuring a low temperature increase in the multilayer components over long-term use while at the same time ensuring adequate deflection $S_3$ is disclosed.

DETAILED DESCRIPTION

Figure 1:
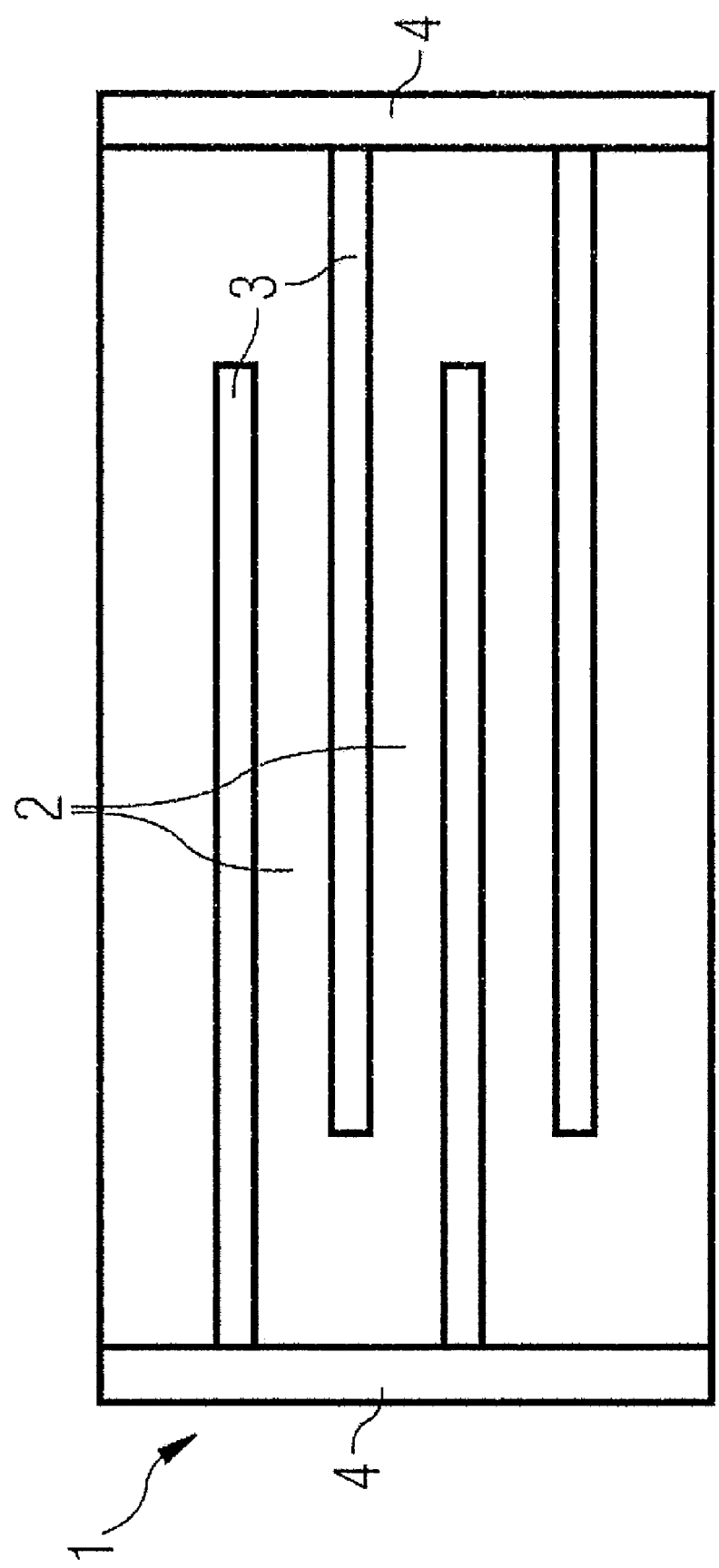
FIG. 1 shows a segment of a multilayer piezo-acutator.

FIG. 1 shows a segment of a multilayer piezo-actuator 1, which is fabricated making use of the ceramic material described herein. The multilayer piezo-actuator 1 includes a stack of piezoelectrical ceramic layers 2, with electrode layers 3 lying in between. The piezo-actuator 1 also includes outer electrodes 4 on the ceramic body at the side. The piezo-actuator 1 shown in FIG. 1 can be fabricated by forming ceramic green films, which are made from one of the ceramic materials described herein. A plurality of these green films are stacked one on top of another. The electrode layers 3 are arranged between the ceramic green films. The electrode layers 3 can include silver and palladium, for example. But the electrode layers 3 can just as well include copper. The electrode layers 3 can be placed on the individual ceramic green films, for example, by a screen printing process. The stacked ceramic green films are pressed together and then mutually debindered and sintered.

The result is a ceramic body with a stack of piezoelectric ceramic layers 2. The inner electrode layers 3 have structures meshing together as a comb, and every other electrode layer 3 makes contact with the very same outer electrode 4.

The electrical voltage needed for the electrical characterization of the piezo-actuator 1 is applied between the outer electrodes 4.

The ceramic material is characterized by a composition that contains at least a proportion of lead zirconate titanate of the general formula $Pb_{1-3x/2-y/2}SE_x\gamma_{x/2-y/2}Cu'_y(Zr_{0.5515-z}Ti_{0.4485+z})O_3$, wherein $0.01 \leq x \leq 0.04$ and $0 \leq y \leq x/2$. The parameter z can have any value between $-0.15 \leq z \leq +0.15$, preferably $-0.016 \leq z \leq 0.0205$. SE stands for a rare-earth metal, selected from the group La, Nd, Sm, Gd, Tb, Dy, Ho, Er, Tu, Yb, Lu and Y. The parameter x is determined by the valence of the rare-earth metal. The ratio Zr/Ti given by the parameter z is selected based upon the copper content, i.e. upon the parameter y, such that the ceramic material is tailored in terms of its phase state (in the phase state diagram) to the morphotropic phase boundary.

In some embodiments, the phase boundary is not necessarily narrowly defined, rather in the phase state diagram it can correspond to a morphotropic phase range, for example between two defined crystal modifications.

In some embodiments, the insertion of the divalent $Cu^{2+}$ cation in the B positions of the ceramic lattice is prevented for the reasons enumerated below. Even after sintering of the ceramic mass the copper remains monovalent.

As a result of the insertion of $Cu^+$ cations in A positions in the ceramic lattice structure, in terms of the physical properties especially the reduction in dielectric losses L in the ceramic material is achieved, see Table 5.

One advantageous modification in the body composition of the piezoceramic results, for example, from changing the molar ratio Zr/Ti by varying the parameter z according to the formula $Pb_{1-x/2}SE_x\gamma_{x/2}(Zr_{0.555-z}Ti_{0.4485+z})O_3$ to the point at which the morphotropic phase boundary is also reached in the ceramic, which is formed as a result of sintering at ca. 1000° C. under inert conditions in the presence of Cu internal electrodes, in other words without the insertion of silver. In this manner particularly favorable piezoelectric properties for the ceramic can be obtained.

In another variant it is advantageous to tailor the composition of the ceramic material to the copper-containing internal electrodes by adding a select amount of copper oxide to the ceramic mass—varying the parameter y according to the general formula $Pb_{1-3x/2-y/2}SE_x\gamma_{x/2-y/2}Cu_y(Zr_{0.5515-z}Ti_{0.4485+z})O_3$, wherein $0.01 \leq x \leq 0.04$ and $0 < y < x/2$.

If a certain amount of CuO is added to the starting material mixture with a PZT mass stock of a certain composition, it can be assumed that in the subsequent calcination in air an insertion of $Cu^{2+}$ ions in the perovskite lattice structure of the ceramic will occur, wherein $Cu^{2+}$ as an acceptor prefers to occupy B positions, so that as a result of the calcination, assuming a complete conversion, the formula $Pb_{1-3x/2}SE_x\gamma_{x/2}[(Zr_{0.5515-z}Ti_{0.4485+z})]_{1-y}Cu''_yO_{3-y}\gamma_y$ will result. However under the conditions of a combined sintering with copper-containing internal electrodes, $Cu^{2+}$ is not stable. $Cu^+$ ions form and, due to their large ionic radius, prefer to occupy A positions in the perovskite structure.

Accordingly, the sintered ceramic is allocated a composition according to the formula $Pb_{1-3x/2-y/2}SE_x\gamma_{x/2-y/2}Cu_y(Zr_{0.5515-z}Ti_{0.4485+z})O_3$ with $Cu^+$ ions in A positions, for example in the case of y=x with $Pb_{1-3x/2}SE_xCu'_x(Zr_{0.5515-z}Ti_{0.4485+z})O_3$. The vacant oxygen positions, which are formed as a result of the insertion of $Cu^{2+}$ in B positions, are no longer present due to the alteration of the lattice during sintering as a result of $Cu^+$ formation. Once the maximum Cu content (for the given SE cation) has been reached, the Cu, which was added in the form of a copper oxide, will no longer be taken up by the perovskite lattice.

To avoid the insertion of $Cu^{2+}$ ions in B positions, the mass stock of a relevant composition is advantageously first converted without the addition of CuO, after which the copper oxide is added to the slurry as $Cu_2O$, so that the insertion into the A positions of the perovskite lattice structure can take place immediately following a successful debindering of the multilayer piezoelectric component during the sintering process.

Exemplary embodiments are described in greater detail below.

A raw materials mixture comprised of
1) $TiO_2$, $ZrO_2$ or a precursor $(Zr,Ti)O_2$ produced via mixture precipitation,
2) $PbCO_3$ or $Pb_3O_4$,
3) Doping agents from an oxide of a rare-earth metal, for example $Nd_2O_3$, and
4) An admixture of CuO is weighed in with a) a composition that corresponds to or approaches the morphotropic phase boundary and b) a PbO surplus of a maximum of 5% for the purpose of promoting sinter densification. This mixture is subjected to a grinding stage to promote equidistribution of the components in an aqueous suspension, and after filtering and drying, for example at 900 to 950° C. in an air atmosphere, is calcined.

In a further advantageous variant, the copper oxide is not added in the calcination stage. The calcination results in the formation of a piezoceramic perovskite mixed crystal phase.

To achieve a sinter densification of the ceramic mass at only 1000° C., i.e. below the melting point of copper, within 2 to 8 hours, the ceramic powder is finely ground to an average grain size of <0.4 µm. The sinter activity of the powder then proves to be sufficient to produce a ceramic density of greater than 97% of the theoretic density, with simultaneously adequate grain growth and sufficient mechanical strength in the grain structure.

The finely ground ceramic powder is suspended using a dispersant to an aqueous slurry with an approximately 70 m % (=mass percent) solids content, which corresponds to approximately 24 vol-%. In this, the proportion of dispersant, for example ammonium citrate, that is required for an optimal dispersion is specifically determined through a series of experiments, and can be identified with the achievement of a minimum viscosity. In the case of the production of a ceramic that contains copper oxide from a conversion powder, to which no copper oxide was added prior to calcination, a certain amount of the copper(I) oxide $Cu_2O$ is added. For the formation of the piezoceramic green film, approximately 6 m % of a commercial, thermohydrolytically degradable binding agent is added to the dispersed solid powder suspensions. An aqueous polyurethane dispersion has proven advantageous for this purpose. This is mixed, for example, in a Dispermat grinder, which results in a slurry that is suitable for the film extrusion process.

The debindering is then performed thermohydrolytically using water vapor in a nitrogen atmosphere. The hydrolytic separation of the binder occurs for the most part at a relatively low temperature of 220±50° C. and a water vapor partial pressure of >200 mbar. The oxygen partial pressure is set at a level that is compatible with the Cu-containing electrodes, i.e. at which the metallic copper will not oxidize and at which the ceramic will not be reduced. The adjustment of the oxygen partial pressure is accomplished by gettering the oxygen from the nitrogen atmosphere, which contains water vapor, on large Cu surfaces, or by adding hydrogen.

To determine the optimal ceramic composition, for example the ratio of Ti/Zr that corresponds to the morphotropic phase boundary, or the most favorable concentration of copper, first a series of compact, disk-shaped ceramic bodies are produced by stacking multiple 40- to 50-μm-thick green films one on top of another and laminating them. After sintering, the finished ceramic test samples are contacted on both sides and their electrical properties are measured.

The electrical properties of the compact ceramic test samples in the variable composition series are listed in Tables 2 through 4. The electrical properties of actuators having copper-containing internal electrodes and an optimized ceramic composition are listed in Table 5.

Examples of the debindering process for the compact ceramic test samples may be found in Table 1, with the specification of the residual carbon content in the components produced. The saturation temperature for water vapor in the debindering program is 97° C.

TABLE 1

Debindering of Compact Ceramic Test Samples (MLP [multilayer printed boards]) and the Corresponding Multilayer Ceramic Components (Actuators)

| Conditions: R Ramp, H Holding Time | Test Samples | Residual Carbon Content Achieved C |
|---|---|---|
| R: 6.5 K/h ⇒ 100° C., R: 6.2 K/h ⇒ 220° C., R: 5 K/h ⇒ 350° C., R: 15 K/h ⇒ 580° C., H: 15 h R: 150 K/h, Final: 25° C. | Ceramic samples MLP | 220 ppm |
|  | Actuators with 338 Cu Electrodes | 184 ppm |

According to the described decarbonization process and the indicated residual carbon content, in the subsequent sintering process at ca. 1000° C. a densification of the ceramic of >97% of the theoretic density occurs, without any damaging reductive degradation.

To allow the measurement of dielectric properties a gold electrode was applied to each side of the ceramic MLP test samples by means of vapor deposition.

In Table 2 the properties of compact ceramic test samples made from foils $Pb_{1-3x/2-y/2}SE_x\gamma_{x/2-y/2}Cu_y(Zr_{0.5515-z}Ti_{0.4485+z})O_3$ with $Nd_2O_3$ as the dopant and x=0.02, without a copper oxide additive (y=0) are compiled, wherein the Zr/Ti ratio for the test samples was varied. The production took place in an $N_2$ atmosphere at a residual oxygen partial pressure of $p^{O2}=10^{-2}-10^{-3}$ Pa, which was established using the partial pressure for water vapor $p_{H2O}$ and the hydrogen partial pressure $p_{H2}$. Measurements were taken after polarization with E=2 kV/mm, at room temperature.

TABLE 2

Properties of Compact, Square Ceramic MLP Test Samples (side length a = 11.5 mm, thickness h – 1 mm) in the $Pb_{0.97}Nd_{0.02}\gamma_{0.01}$ $(Zr_{0.5515-z}Ti_{0.4485+z})O_3$ Series, for the Purpose of Determining the Morphotropic Phase Boundary, with Indication of Average Statistical Error, for 5 to 10 Individual Test Samples.

| z | Dielectric Constant ε | Temperature Coefficient TKε | Piezoelectric Load Constant $D_{33}$ [pm V$^{-1}$] | Density P [g cm$^{-3}$] |
|---|---|---|---|---|
| 0 | 1339 ± 9 | 6037 ± 225 | 720 ± 5 | 7.76 ± 0.04 |
| 0.0025 | 1360 ± 23 | 4985 ± 91 | 728 ± 12 | 7.54 ± 0.10 |
| 0.005 | 1330 ± 15 | 5094 ± 150 | 723 ± 8 | 7.59 ± 0.02 |
| 0.009 | 1527 ± 28 | 3913 ± 247 | 753 ± 14 | 7.89 ± 0.02 |
| 0.0125 | 1436 ± 74 | 3083 ± 265 | 714 ± 40 | 7.90 ± 0.02 |
| 0.0205 | 1598 ± 21 | 2740 ± 110 | 707 ± 20 | 7.88 ± 0.02 |

As is shown in the table, the small signal dielectric constant ε increases and the temperature coefficient TKε decreases with the variation of the z-value, while the $d_{33}$ value reaches a maximum level at z=0.009. Accordingly, the formula $Pb_{0.97}Nd_{0.02}\gamma_{0.01}$ $(Zr_{0.5425}Ti_{0.4575})O_3$ corresponds to a ceramic mass that is tailored to the morphotropic phase boundary for a preparation without added CuO.

In Table 3 the properties of compact ceramic test samples produced from foils and having the composition $Pb_{1-3x/2-y/2}SE_x\gamma_{x/2-y/2}Cu_y(Zr_{0.5515-z}Ti_{0.4485+z})O_3$ with $Nd_2O_3$ as the dopant and x=0.02 and z=0 are compiled, wherein the copper content was varied with the parameter y and in one case (in which y=0.04) exceeds the upper limit for homogeneous solubility in the perovskite lattice structure that is defined by x=y. The test samples were produced under $N_2$ at a residual oxygen partial pressure of $P_{O2}=10^{-2}-10^{-3}$ Pa, established using $p_{H2O}$ and $p_{H2}$. Measurements were taken following polarization with E=2 kV/mm, at room temperature.

TABLE 3

Properties of Compact, Square Ceramic MLP Test Samples (side length a = 11.5 mm, thickness h = 1 mm) in the $Pb_{0.97-y/2}Nd_{0.02}Cu_y$ $(Zr_{0.5515}Ti_{0.4485})O_3$ Series, for the Purpose of Determining an Optimal Copper Content, with Indication of Average Statistical Error, for 5 to 10 Individual Test Samples.

| y | Dielectric Constant ε | Temperature Coefficient TKε | Piezoelectric Load Constant $d_{33}$ [pm V$^{-1}$] | Density p [g cm$^{-3}$] |
|---|---|---|---|---|
| 0 | 1339 ± 9 | 6037 ± 225 | 720 ± 5 | 7.76 ± 0.04 |
| 0.005 | 1125 ± 6 | 4202 ± 19 | 645 ± 6 | 7.78 ± 0.03 |
| 0.010 | 1100 ± 21 | 3466 ± 136 | 540 ± 11 | 7.58 ± 0.11 |
| 0.020 | 1317 ± 11 | 4107 ± 105 | 739 ± 4 | 7.71 ± 0.03 |
| 0.040 | 1151 ± 16 | 4112 ± 406 | 641 ± 11 | 7.93 ± 0.11 |

The values listed in the table indicate that the ceramic composition in which y=0.02 corresponds to an optimal copper content.

In keeping with the above process, in Table 4 the ratio Zr/Ti was again varied, in order to determine the morphotropic phase boundary for a Cu content of y=0.02.

TABLE 4

Properties of Compact, Square Ceramic MLP Test Samples (side length a = 11.5 mm, thickness h = 1 mm) in the $Pb_{0.96}Nd_{0.02}Cu_{0.02}$ $(Zr_{0.5515-z}Ti_{0.4485+z})O_3$ Series, for the Purpose of Determining the Morphotropic Phase Boundary, with Indication of Average Statistical Error, for 5 to 10 Individual Test Samples.

| z | Dielectric Constant $\epsilon$ | Temperature Coefficient $TK\epsilon$ | Piezoelectric Load Constant $d_{33}$ [pm V$^{-1}$] | Density $\rho$ [g cm$^{-3}$] |
|---|---|---|---|---|
| −0.016 | 1005 ± 13 | 4970 ± 52 | 500 ± 6 | 7.40 ± 0.03 |
| −0.008 | 1037 ± 15 | 4484 ± 207 | 454 ± 9 | 7.40 ± 0.03 |
| 0 | 1317 ± 1 | 4107 ± 105 | 739 ± 4 | 7.71 ± 0.03 |
| 0.009 | 1208 ± 32 | 3717 ± 58 | 581 ± 26 | 7.88 ± 0.02 |
| 0.0125 | 1214 ± 37 | 3707 ± 67 | 566 ± 11 | 7.89 ± 0.03 |
| 0.0205 | 1226 ± 39 | 3380 ± 115 | 513 ± 18 | 7.90 ± 0.02 |

It has been found that with the apparently optimal Cu content of y=0.02, which is controlled by the SE cation content, in this case Nd$^{3+}$, the best value for the piezoelectric load constant $d_{33}$ is again at a value of z=0, in other words with the insertion of Cu$^+$ ions in place of Ag$^+$ ions, the morphotropic phase boundary is established at approximately equal concentrations of Ti and Zr, i.e. at a Zr/Ti ratio of approximately 1.

Multilayer piezoelectric components (actuators), for example piezo stacks having several hundred copper-containing internal electrodes, that are based upon the ceramic masses disclosed herein, are produced according to standard methods of printing the ceramic layers with a copper paste, stacking the printed ceramic layers, laminating them, debindering them, and sintering them.

In Table 5 the properties of three actuators having the different ceramic compositions 1) $Pb_{0.97}Nd_{0.02}\gamma_{0.01}(Zr_{0.5515}Ti_{0.4485})O_3$ without adjustment for Cu internal electrodes;

2) $Pb_{0.97}Nd_{0.02}\gamma_{0.01}(Zr_{0.5515}Ti_{0.4575})O_3$ with adjustment of the Zr/Ti ratio for Cu internal electrodes;

3) $Pb_{0.96}Nd_{0.02}Cu_{0.02}(Zr_{0.5515}Ti_{0.4485})$ with a Cu content tailored to the dopant and established morphotropic phase boundary, each with 360 internal electrodes and a ceramic layer thickness of 80 μm are compiled, with measurements being taken after a polarization with E=2 kV/mm, (a) at room temperature and (b) at 180° C. In addition to the small-signal properties $\in$ and TK$\in$, in this case the large-signal dielectric constant is also indicated, which can be calculated from the polarization using a voltage, which for example in the actuators results in a deflection of 40 μm.

TABLE 5

Properties of Actuators with Copper-Containing Internal Electrodes Base Upon the Ceramic 1) $Pb_{0.97}Nd_{0.02}\gamma_{0.01}(Zr_{0.5515}Ti_{0.4485})O_3$ without the addition of copper oxide and without adjustment for the morphotropic phase boundary,
2) $Pb_{0.97}Nd_{0.02}\gamma_{0.01}(Zr_{0.5425}Ti_{0.4575})O_3$ with adjustment of the Zr/Ti ratio to the morphotropic phase boundary, and
3) a ceramic $Pb_{0.96}Nd_{0.02}Cu_{0.02}(Zr_{0.5515}Ti_{0.4485})$, modified by the addition of copper oxide, the Zr/Ti ratio of which is tailored to the morphotropic phase boundary. Measurements were taken following a polarization with 2 kV/mm (a) at room temperature and (b) at 180° C.

| z | Dielectric Constant Small Signal | Dielectric Constant Large Signal | Temperature Coefficient TK $\epsilon$ (small signal) | Piezoel. Load Constant $d_{33}$ [pm V$^{-1}$] | Efficiency Level η | Dielectric Loss Energy L [mJ] |
|---|---|---|---|---|---|---|
| (1) (a) | 1214 ± 30 | 3110 ± 87 | 3936 ± 82 | 592 ± 18 | 50.4 ± 0.4 | 50 ± 2 |
| (b) | | 2772 ± 50 | | 632 ± 11 | 56.5 ± 0.4 | 34 ± 1 |
| (2) (a) | 1358 ± 27 | 2984 ± 118 | 2949 ± 41 | 568 ± 15 | 51 ± 0.7 | 51 ± 2 |
| (b) | | 2841 ± 57 | | 614 ± 11 | 57 ± 1 | 37 ± 2 |
| (3) (a) | 1216 ± 8 | 2747 ± 102 | 2860 ± 42 | 569 ± 11 | 55 ± 1 | 44 ± 1 |

From the figures listed in Table 5, a comparison of the actuators containing the two ceramics (1) and (2) shows an improvement in properties in terms of a reduction in the TK$\in$ in the ceramic 2a relative to the ceramic 1a. However a significant reduction in the dielectric loss energy L results only with the insertion of copper. At 44 mJ, the value for the dielectric loss L for the ceramic (3) with polarization at room temperature lies well below the values for those actuators that were produced using the ceramic without copper oxide additive. A further improvement can be achieved with thermal polarization at, for example, 180° C. In addition, in this case the dependence of the small-signal capacitance on the temperature is lower.

Although the invention has been detailed using only a small number of exemplary embodiments, it can be used to produce ceramic materials having any values for the parameters x, y and z. In principle, other raw material masses and copper additives or additives containing copper oxide that are not mentioned here but are suitable for producing the ceramic of the indicated general composition can also be used. Suitable raw material masses are known, for example, from the publication DE 20023051 U1.

The invention claimed is:

1. A piezoelectric ceramic material having a general composition of $ABO_3$, the piezoelectric ceramic material comprising:

lead zirconate titanate having a perovskite lattice structure, wherein A stands for A positions in the perovskite lattice structure and B stands for B positions in the perovskite lattice structure, the lead zirconate titanate comprising at least a proportion of lead zirconate titanate of $Pb_{1-3x/2-y/2}SE_x\gamma_{x/2-y/2}Cu^I_y(Zr_{0.5515-z}Ti_{0.4485+z})O_3$, wherein:

$\gamma$ is a vacancy in a crystal lattice of the lead zirconate titanate;

a value of x is from about 0.01 to about 0.04;

a value of y is from about 0 to about the value of x divided by two;

SE is a rare-earth metal selected from the group consisting of La, Nd, Sm, Gd, Tb, Dy, Ho, Er, Tu, Yb, Lu and Y, x is determined by a valence of the rare-earth metal, and z is selected based on the value of y such that the piezoelectric ceramic material corresponds to a morphotropic phase boundary.

2. The piezoelectric ceramic material of claim 1, wherein Cu is in the perovskite lattice structure of the piezoelectric ceramic material at least partially in the A positions.

3. The piezoelectric ceramic material of claim 2, wherein the Cu inserted in A positions is a monovalent, positive cation Cu+.

4. The piezoelectric ceramic material of claim 1, wherein the piezoelectric ceramic material comprises $Pb_{0.96}Nd_{0.02}Cu_{0.02}(Zr_{0.5515}Ti_{0.4485})O_3$.

5. A method for producing a ceramic material according to claim 1, the method comprising:

preparing a materials mixture that includes copper oxide (CuO), performing a calcination of the materials mixture under inert conditions in a reduced atmosphere under an oxygen partial pressure at which Cu and CuO are in equilibrium and coexist to form a calcined ceramic product, grinding the calcined ceramic product;

homogenizing the calcined ceramic product; and sintering the calcined ceramic product.

6. The method of claim 5, wherein performing the calcination of the ceramic raw materials mixture comprises performing the calcination in a moist nitrogen atmosphere.

7. The method of claim 5, wherein sintering the calcined ceramic product comprises sintering the calcined ceramic product in a moist nitrogen atmosphere.

8. A method for producing a ceramic material according to claim 1, the method comprising:

performing a calcination of a materials mixture without a copper oxide (CuO) additive is to form a piezoceramic perovskite mixed-crystal phase material;

adding copper oxide $Cu_2O$ to a slurry, wherein the copper oxide is about evenly distributed throughout the slurry;

grinding the piezoceramic perovskite mixed-crystal phase material to form a ground material;

mixing the ground material with the slurry to form a ceramic mass; and sintering the ceramic mass under inert conditions.

9. The method of claim 8, wherein sintering the ceramic mass comprises sintering the ceramic mass in a moist nitrogen atmosphere.

10. A multilayer piezoelectric component comprising:

a plurality of ceramic layers comprising the ceramic material of claim 1; and a plurality of internal electrode layers, wherein the ceramic layers and the electrode layers alternate.

11. The multilayer piezoelectric component of claim 1, wherein the internal electrode layers include at least a proportion of metallic copper.

12. The multilayer piezoelectric component of claim 1, wherein a value of z is from about −0.15 to about +0.15.

13. The multilayer piezoelectric component of claim 1, wherein a value of z is from about −0.016 to about +0.0205.

* * * * *